United States Patent
Vopat et al.

(10) Patent No.: US 8,330,128 B2
(45) Date of Patent: Dec. 11, 2012

(54) IMPLANT MASK WITH MOVEABLE HINGED MASK SEGMENTS

(75) Inventors: Robert B. Vopat, Austin, TX (US); William T. Weaver, Austin, TX (US); Charles T. Carlson, Cedar Park, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 180 days.

(21) Appl. No.: 12/757,616

(22) Filed: Apr. 9, 2010

(65) Prior Publication Data
US 2010/0314559 A1 Dec. 16, 2010

Related U.S. Application Data

(60) Provisional application No. 61/170,146, filed on Apr. 17, 2009.

(51) Int. Cl.
*G21K 5/10* (2006.01)
*H01J 37/08* (2006.01)
*H01L 21/425* (2006.01)

(52) U.S. Cl. .......... 250/492.22; 250/492.2; 250/492.21; 204/298.11; 438/531; 438/943

(58) Field of Classification Search ............. 204/298.11; 438/514, 531, 551, 942; 250/492.1, 492.21, 250/492.2
See application file for complete search history.

(56) References Cited

U.S. PATENT DOCUMENTS

| | | | | |
|---|---|---|---|---|
| 5,229,615 A * | 7/1993 | Brune et al. | | 250/492.2 |
| 5,863,712 A * | 1/1999 | Von Bunau et al. | | 430/396 |
| 5,912,094 A * | 6/1999 | Aksyuk et al. | | 430/5 |
| 6,689,255 B2 | 2/2004 | Baldwin et al. | | |
| 6,930,316 B2 | 8/2005 | Nishihashi et al. | | |
| 7,374,962 B2 * | 5/2008 | Huang et al. | | 438/67 |
| 2002/0066872 A1 * | 6/2002 | Nishihashi et al. | | 250/492.21 |
| 2004/0207074 A1 * | 10/2004 | MacDonald et al. | | 257/708 |
| 2006/0258128 A1 | 11/2006 | Nunan et al. | | |
| 2007/0000443 A1 | 1/2007 | Chien | | |
| 2007/0002785 A1 * | 1/2007 | Heo | | 438/671 |
| 2009/0068783 A1 | 3/2009 | Borden | | |
| 2009/0227062 A1 | 9/2009 | Sullivan et al. | | |
| 2009/0227094 A1 | 9/2009 | Bateman et al. | | |
| 2009/0227095 A1 | 9/2009 | Bateman et al. | | |
| 2009/0308440 A1 | 12/2009 | Abidi et al. | | |

FOREIGN PATENT DOCUMENTS

JP 8329880 A 12/1996

* cited by examiner

*Primary Examiner* — Phillip A Johnston
*Assistant Examiner* — Brooke Purinton

(57) ABSTRACT

This apparatus has two mask segments. Each mask segment has apertures that an ion beam may pass through. These mask segments can move between a first and second position using hinges. One or more workpieces are disposed behind the mask segments when these mask segments are in a second position. The two mask segments are configured to cover the one or more workpieces in one instance. Ions are implanted into the one or more workpieces through the apertures in the mask segments.

19 Claims, 10 Drawing Sheets

US 8,330,128 B2

IMPLANT MASK WITH MOVEABLE HINGED MASK SEGMENTS

CROSS-REFERENCE TO RELATED APPLICATIONS

This application claims priority to the provisional patent application entitled "Implant Mask with Moveable Mask Segments," filed Apr. 17, 2009 and assigned U.S. App. No. 61/170,146, the disclosure of which is hereby incorporated by reference.

FIELD

This invention relates to masks used during ion implantation and, more particularly, to masks used for implanting solar cells.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity after activation.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

In the past, solar cells have been doped using a dopant-containing glass or a paste that is heated to diffuse dopants into the solar cell. This does not allow precise doping of the various regions of the solar cell and, if voids, air bubbles, or contaminants are present, non-uniform doping may occur. Solar cells could benefit from ion implantation because ion implantation allows precise doping of the solar cell. Solar cells, however, may require that certain patterns of dopants be implanted or that only certain regions be implanted with ions. Previously, implantation of only certain regions of a workpiece has been accomplished using photoresist. Use of photoresist, however, would add an extra cost to solar cell production because extra process steps are involved. This also poses a difficulty if the regions to be implanted are extremely small. Other hard masks on the solar cell surface likewise are expensive and require extra steps. Accordingly, there is a need in the art for an improved implant mask and, more particularly, an improved implant mask for solar cells.

SUMMARY

According to a first aspect of the invention, an apparatus for implanting workpieces is provided. The apparatus comprises a workpiece that is disposed in a path of an ion beam. This workpiece has a first area. Two mask segments each have a plurality of apertures. The two mask segments are configured to cover the first area of the workpiece. A hinge is disposed on each of the mask segments.

According to a second aspect of the invention, a method of implantation is provided. The method comprises disposing a workpiece on a platen. A plurality of mask segments are translated from a first position to a second position. Each mask segment has a plurality of apertures. A first ion implant of the workpiece is performed through the plurality of apertures into the workpiece. The plurality of mask segments are translated from the second position to the first position According to a third aspect of the invention, a method of implantation is provided. The method comprises loading a first workpiece on a platen behind a first mask segment and a second mask segment. Each mask segment has a plurality of apertures. The first mask segment is translated from a first position to a second position. An ion beam is implanted through the plurality of apertures of the first mask segment into the first workpiece. A second workpiece is loaded on the platen. The second mask segment is translated from a first position to a second position. The ion beam is implanted through the plurality of apertures of the second mask segment into the second workpiece. The first mask segment is translated from the second position to the first position and the first workpiece is unloaded.

BRIEF DESCRIPTION OF THE DRAWINGS

For a better understanding of the present disclosure, reference is made to the accompanying drawings, which are incorporated herein by reference and in which.

DETAILED DESCRIPTION

The mask is described herein in connection with solar cells. However, the mask can be used with, for example, semiconductor wafers, light emitting diodes (LEDs), or flat panels. While a beamline ion implanter is specifically disclosed, embodiments of this apparatus may be used in, for example, a plasma doping implanter, plasma immersion implanter, flood implanter, or other plasma processing equipment known to those skilled in the art. Thus, the invention is not limited to the specific embodiments described below.

Figure 1:
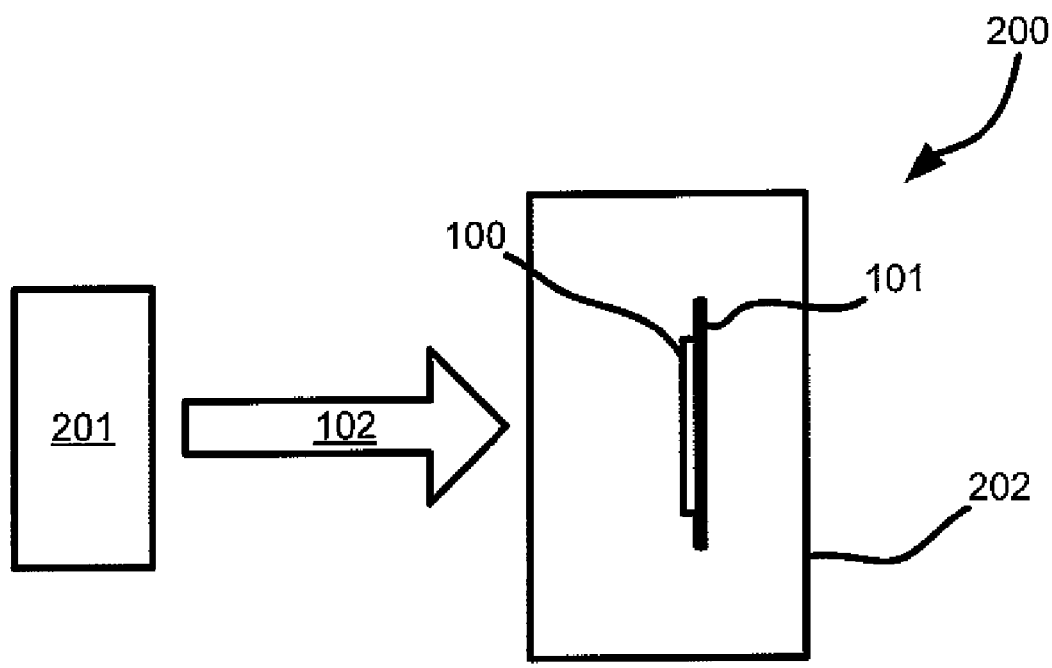
FIG. 1 is a block diagram of a beamline ion implanter.

FIG. 1 is a block diagram of a beamline ion implanter 200. Those skilled in the art will recognize that the beamline ion implanter 200 is only one of many examples of beamline ion implanters. In general, the beamline ion implanter 200 includes an ion source 201 to generate ions that are extracted to form an ion beam 102, which may be, for example, a ribbon beam or a spot beam. The ion beam 102 may be mass analyzed and converted from a diverging ion beam to a ribbon ion beam with substantially parallel ion trajectories in one instance. In another embodiment, the ion beam 102 is a spot beam. In yet another embodiment, the ion beam 102 is not mass analyzed.

An end station 202 supports one or more workpieces, such as workpiece 100, in the path of the ion beam 102 such that ions of the desired species are implanted into the workpiece 100. In one instance, the workpiece 100 is a solar cell. The end station 202 may include a platen 101 to support the workpiece 100. The end station 202 also may include in one embodiment a scanner for moving the workpiece 100 perpendicular to the long dimension of the ion beam 102 cross-section, thereby distributing ions over the entire surface of workpiece 100.

The ion implanter 200 may include additional components known to those skilled in the art such as automated workpiece handling equipment, Faraday sensors, or an electron flood gun. It will be understood to those skilled in the art that the entire path traversed by the ion beam 102 is evacuated during ion implantation. The beamline ion implanter 200 may incorporate hot or cold implantation of ions in some embodiments.

Figure 2:
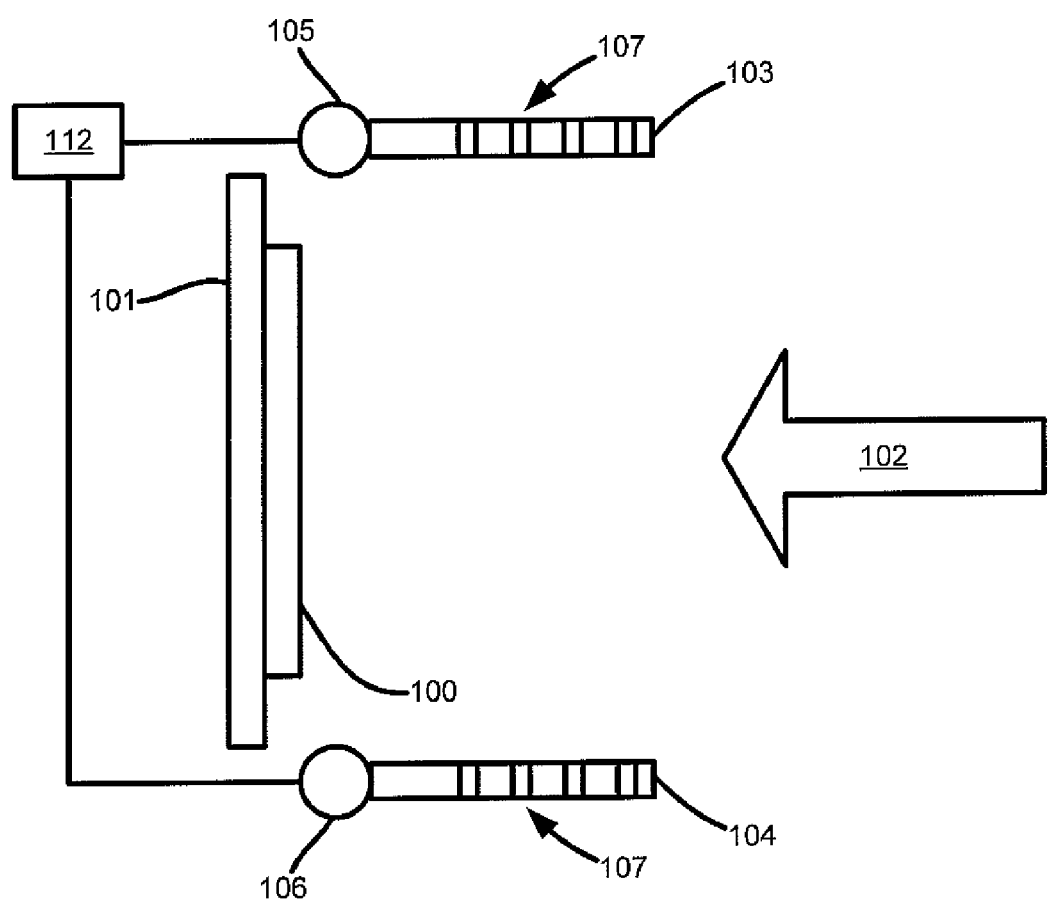
FIG. 2 is a top cross-sectional view of an embodiment of a mask in a first position.

FIG. 2 is a top cross-sectional view of an embodiment of a mask in a first position. In one instance, this first position may be referred to as an open position. The workpiece 100, which may be a solar cell, is disposed on a platen 101. The workpiece 100 may be doped or undoped. An ion beam 102 is directed at the workpiece 100 in this particular embodiment. The ion beam 102 may be generated by, for example, the beamline ion implanter 200. Of course, other ion implanter designs known to those skilled in the art also may be used. The workpiece 100 may be held to the platen 101 using an electrostatic clamping force, physical clamping forces, or gravity, for example.

In the embodiment illustrated in FIG. 2, the mask segments 103, 104 are positioned on hinges 105, 106. The hinges 105, 106 may be a pivot or flexure bearing, for example. These mask segments 103, 104 may be fabricated of graphite, carbon carbon, silicon carbide, silicon nitride, quartz, or other materials that will not contaminate the ion beam 102 or workpiece 100 during implant. The mask segments 103, 104 each have at least one opening 107. The openings 107 can vary in shape, dimensions, spacing, or pattern depending on the desired implant into the workpiece 100. Placing the mask segments 103, 104 in the first position allows the ion beam 102 to implant the entire surface of the workpiece 100. In one instance, this may be a blanket implant of an entire surface of the workpiece 100. Of course, the workpiece 100 also may be loaded or unloaded from the platen 101 when the mask segments 103, 104 are in the first position. The workpiece 100 may be loaded or unloaded when the ion beam 102 is not being directed at the workpiece 100. Loading or unloading may take place when the platen 101 is in a horizontal or vertical position.

Figure 3:
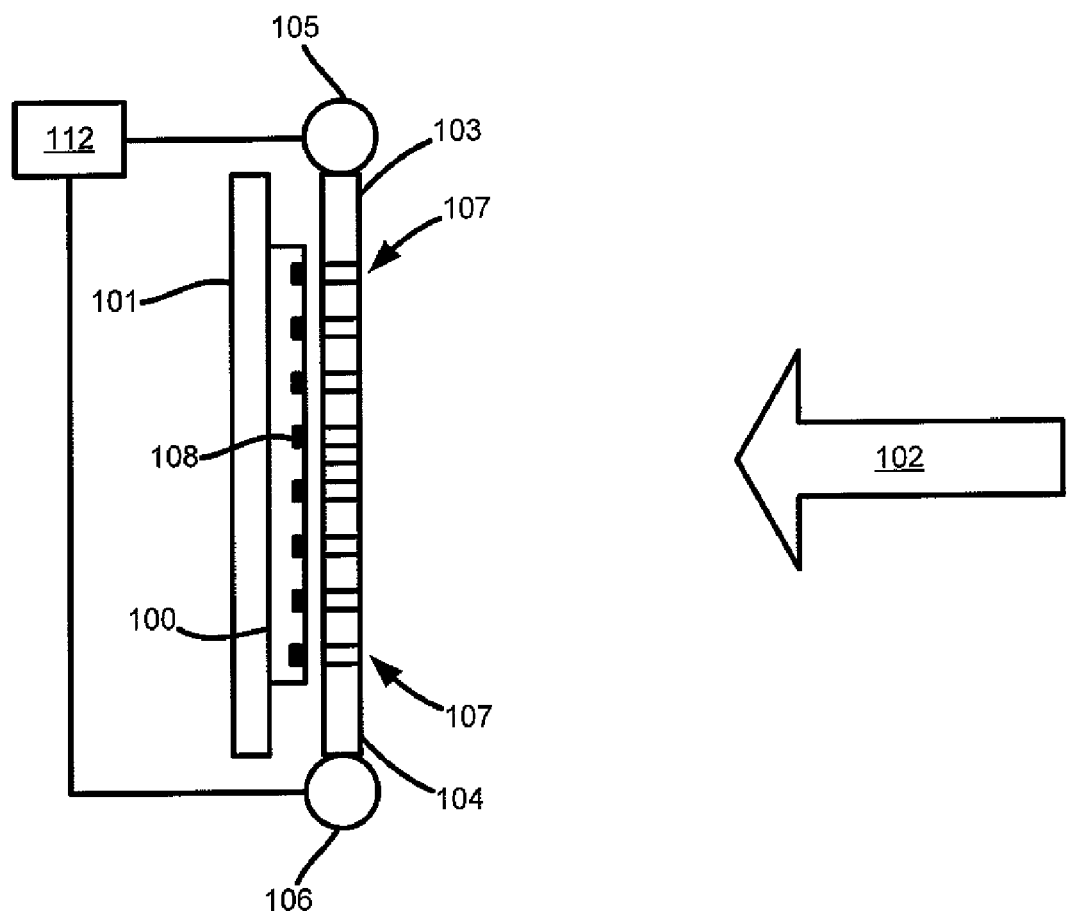
FIG. 3 is a top cross-sectional view of an embodiment of a mask in a second position.

FIG. 3 is a top cross-sectional view of an embodiment of a mask in a second position. The mask segments 103, 104 have moved to a second position in this embodiment using the hinges 105, 106. In one instance, this second position may be referred to as a closed position. The mask segments 103, 104 are operatively linked to an actuator system 112 that moves the mask segments 103, 104 between the first position and second position. The actuator system 112 may be located behind the platen 101 or near the hinges 105, 106. The actuator 112 may be connected to a controller. The mask segments 103, 104 may move using pneumatic power in this particular embodiment, but other movement methods also may be used. In an alternate embodiment, mechanical power using cams, springs, or linkages may be used. In yet another alternate embodiment, the physical movement of the platen 101 can be used to push or pull the mask segments 103, 104 between the first position and second position. This embodiment may use tension or springs.

In the second position, the mask segments 103, 104 each cover approximately half the length of the workpiece 100. In another embodiment, the workpiece 100 may not be centered on the platen 101 and each mask segment 103, 104 may cover unequal portions of the workpiece 100. The mask segments 103, 104 may each have a length over half the length of the workpiece 100. The dimensions of the mask segments 103, 104, however, may vary based on the number of workpieces 100 on the platen 101.

The ion beam 102 is directed at the workpiece 100. The mask segments 103, 104 block the ion beam 102 except in regions 108 (the dark regions illustrated in FIG. 3) of the workpiece 100 disposed behind the openings 107. In one instance, this implant when the mask segments 103, 104 are in the second position may be a patterned or selective implant of the workpiece 100. For example, the regions of a solar cell where conductive contacts are applied may be doped using such a patterned implant and may correspond to the regions 108. The implants while the mask segments 103, 104 are in the first position and second position may be performed without breaking vacuum. The ion beam 102 may not be directed at the workpiece 100 when the mask segments 103, 104 move between a first position and a second position.

While the embodiment of FIGS. 2-3 illustrates only one workpiece 100, other embodiment may include multiple workpieces 100. The ion beam 102 may be, for example, a ribbon beam or a spot beam. The ion beam 102, mask segments 103, 104, and/or the workpiece 100 may scan during the implant process. The mask segments 103, 104 and hinges 105, 106 may be mounted to the platen 101, the end station 202, other components of an implant chamber, or a mechanism that supports the platen 101.

The mask segments 103, 104 may include workpiece 100 alignment mechanisms. For example, the mask segments 103, 104 may include ledges or pins that the workpiece 100 can align to. Such ledges or pins may be disposed on the platen 101 or the mask segments 103, 104. The workpiece 100 may use gravity or other forces to align to a ledge or pin. The ledges or pins also may push the workpiece 100 into a proper position on the platen 101 or behind the mask segments 103, 104. Pins or ledges on the mask segments 103, 104 also may align to components of the platen 101 to ensure alignment between the mask segments 103, 104 and the platen 101. The alignment mechanisms also may align the workpiece 100 to the apertures 107 or the mask segments 103, 104. Other workpiece alignment mechanisms also may be included.

Figure 4:
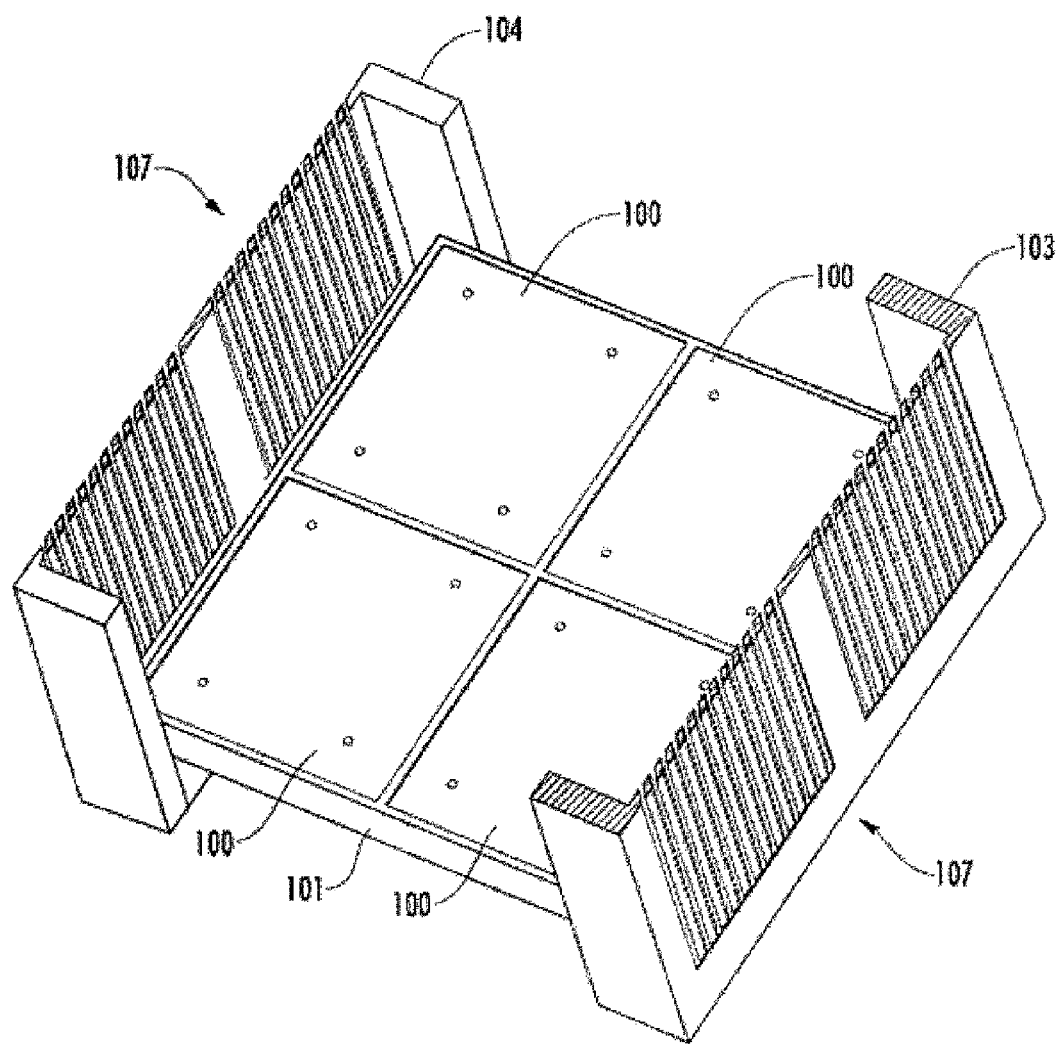
FIG. 4 is a front perspective view of an embodiment of a mask in a first position.
Figure 5:
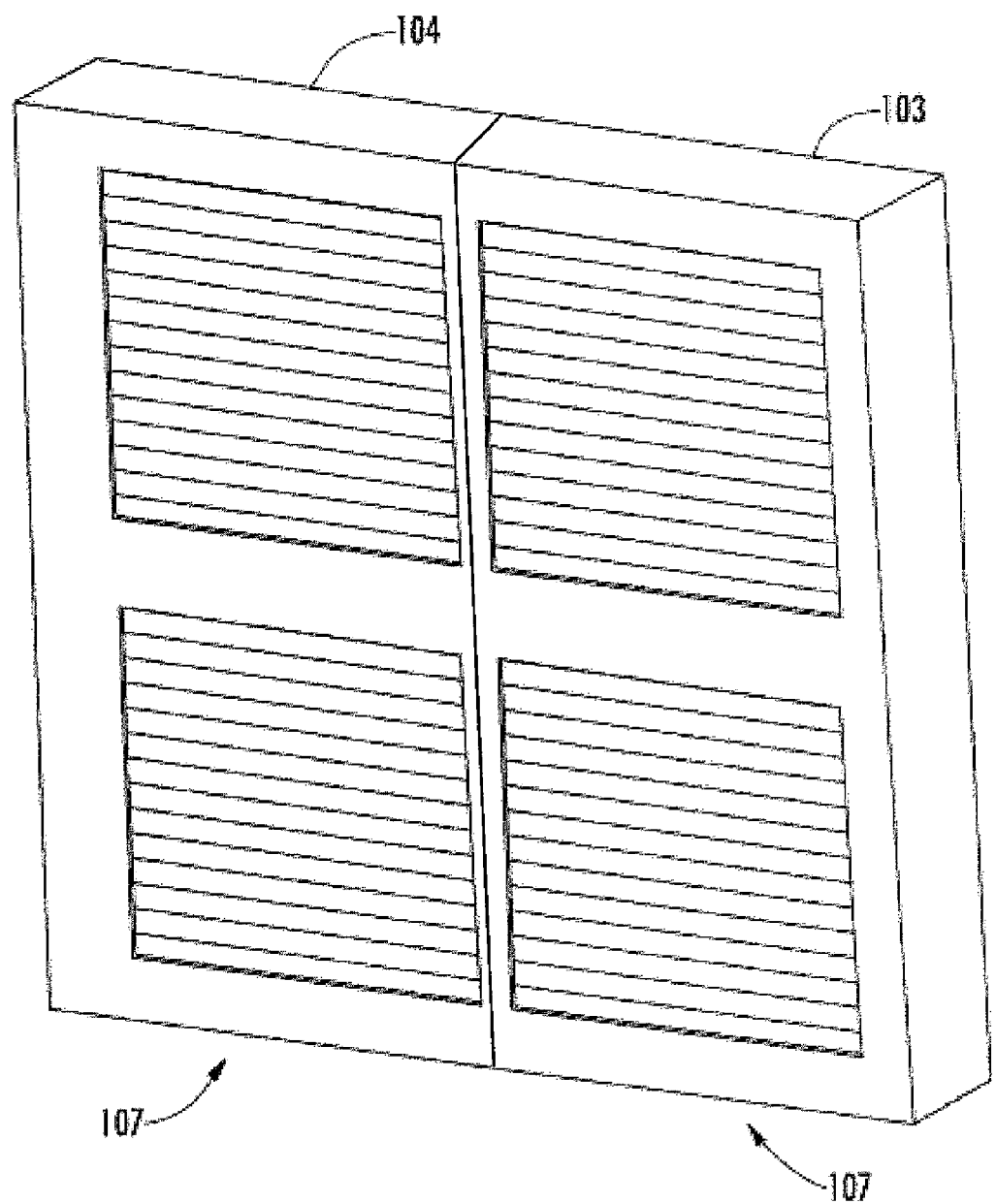
FIG. 5 is a front perspective view of an embodiment of a mask in a second position.

FIG. 4 is a front perspective view of an embodiment of a mask in a first position. FIG. 5 is a front perspective view of an embodiment of a mask in a second position. In the first position of FIG. 4, the mask segments 103, 104 expose the workpieces 100. This may be to implant the workpieces 100 or load/unload the workpieces 100. In the second position of FIG. 5, the mask segments 103, 104 are in a second position. During implant, an ion beam will implant only through the openings 107. The mask segments 103, 104 block the remainder of the ion beam 102. In the embodiments of FIGS. 4-5, four workpieces 100 are illustrated on the platen 101. Other numbers or configurations of workpieces 100 are possible than those illustrated herein. Furthermore, while the apertures 107 are illustrated as horizontal in FIGS. 4-5, the apertures 107 also may be vertical or other configurations known to those skilled in the art.

While only two mask segments 103, 104 are illustrated in FIGS. 4-5, in an alternate embodiment there are multiple pairs of mask segments working together. Each pair of mask segments may be disposed in front of a single workpiece 100 or multiple workpieces 100. These multiple pairs of mask segments may operate in unison or independently.

Figure 6:
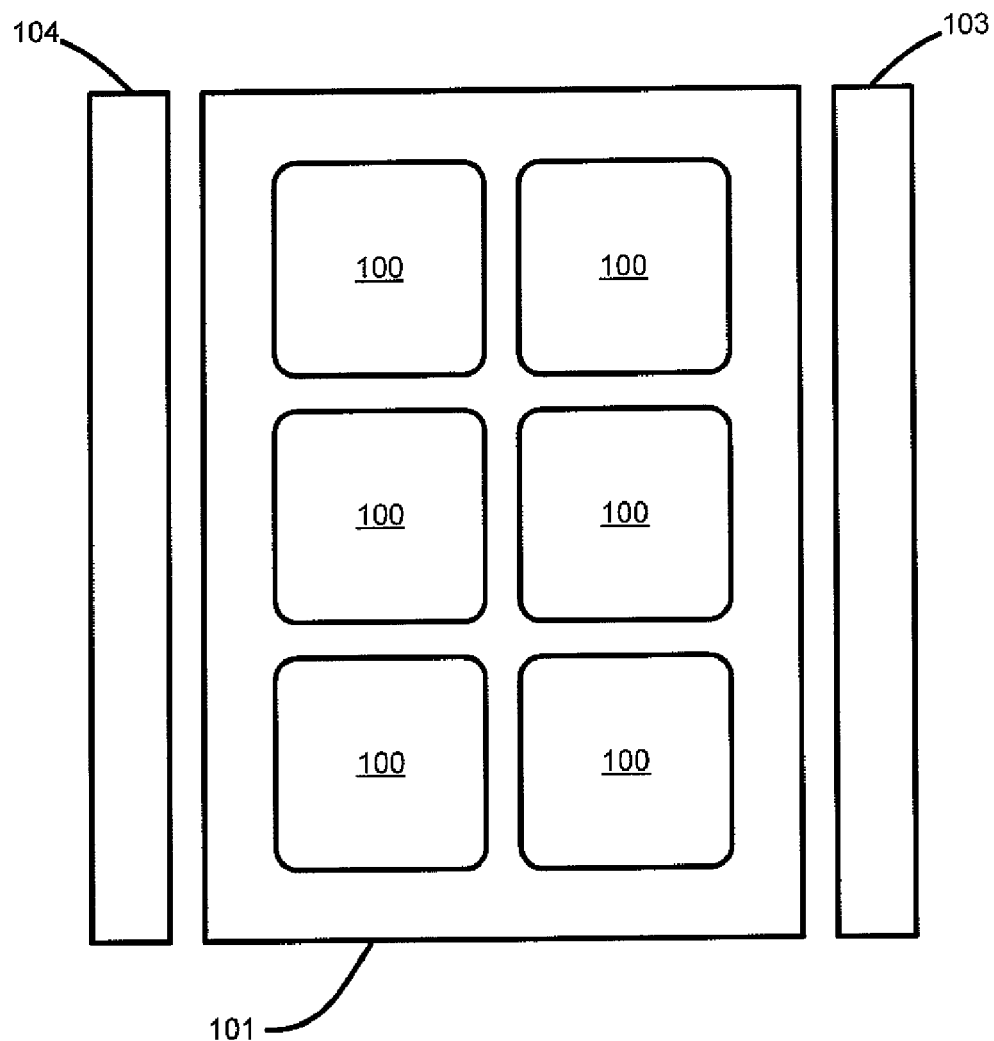
FIG. 6 is a front perspective view of a second embodiment of a mask in a first position.

FIG. 6 is a front perspective view of a second embodiment of a mask in a first position. In this particular embodiment, six workpieces 100 are disposed on the platen 101 in a 2×3 configuration. Other numbers of workpieces 100 or configurations of workpieces 100 on the platen 101 are possible. The mask segments 103, 104 are in a first position in FIG. 6.

Figure 7:
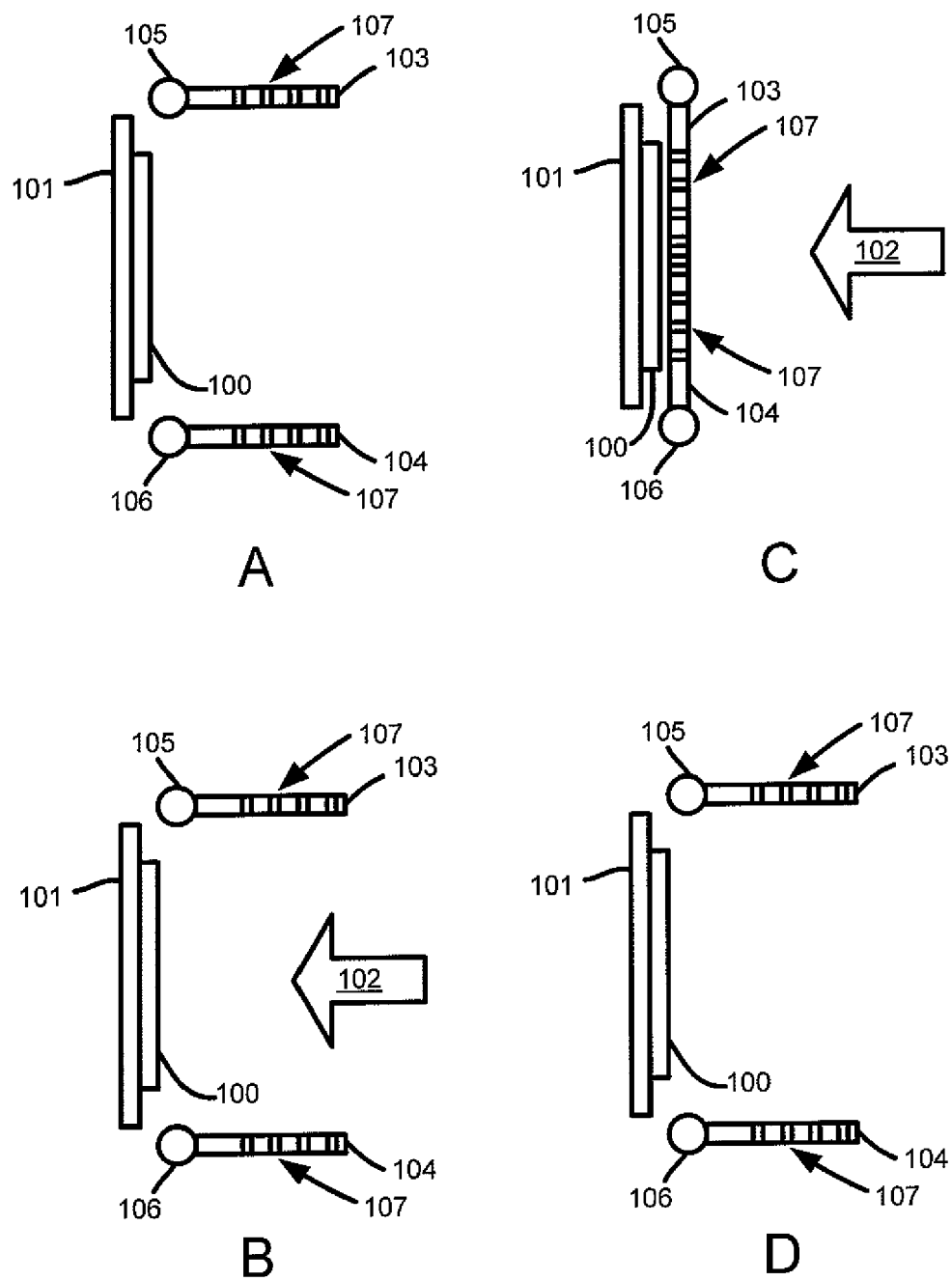
FIGS. 7A-D are top cross-sectional views of a first embodiment of ion implantation.

FIGS. 7A-D are top cross-sectional views of a first embodiment of ion implantation. In FIG. 7A, the mask segments 103, 104 are in a first position. The workpiece 100 may be loaded onto the platen 101. In FIG. 7B, the ion beam 102 is directed at the workpiece 100 and performs a blanket implantation of an entire surface of the workpiece 100. In FIG. 7C, the mask segments 103, 104 move to a second position using the hinges 105, 106. The ion beam 102 is directed at the workpiece 100 through the openings 107 in the mask segments 103, 104. This implant in FIG. 7C may perform a selective or patterned implant of only a portion of the surface of the workpiece 100. In FIG. 7D, the mask segments 103, 104 move back to a first position. The workpiece 100 may be unloaded. In one instance, this embodiment of FIGS. 7A-D may enable a blanket dose of ions across a workpiece 100 and then a selective implant dose of ions in certain regions of the workpiece 100 where conductive contacts may later be formed. This may enable a selective emitter (SE) solar cell design.

While the blanket implant of the workpiece 100 when the mask segments 103, 104 are in a first position is illustrated before the selective or patterned implant of the workpiece 100 when the mask segments 103, 104 are in a second position, these steps may occur in either order. In an alternate embodiment, the blanket implant of FIG. 7B may be skipped and only the selective implant of FIG. 7C may occur. Furthermore, more than one workpiece 100 may be disposed on the platen 101 in the embodiment of FIG. 7.

Figure 8:
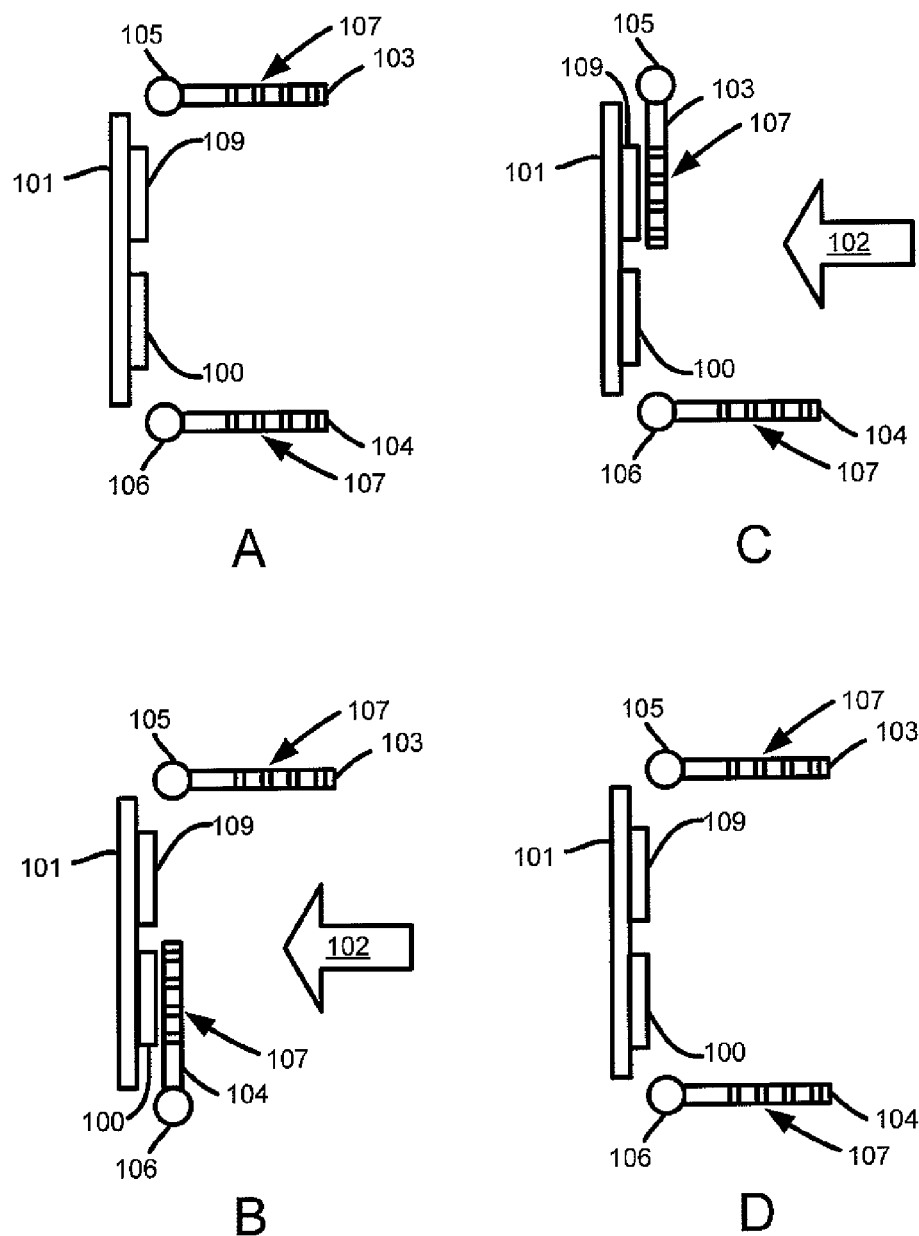
FIGS. 8A-D are top cross-sectional views of a second embodiment of ion implantation.

FIGS. 8A-D are top cross-sectional views of a second embodiment of ion implantation. In FIG. 8A, the mask segments 103, 104 are in a first position. The workpieces 100, 109 may be loaded onto the platen 101. In FIG. 8B, the mask segment 104 moved to a second position while the mask segment 103 remains in the first position. An ion beam is directed at the workpieces 100, 109. The ion beam 102 performs a blanket implantation of an entire surface of the workpiece 109 and a selective or patterned implant of only a portion of the surface of the workpiece 100 through the openings 107 in the mask segment 104. In FIG. 8C, the mask segment 104 moved to a first position while the mask segment 103 moved to a second position. An ion beam is directed at the workpieces 100, 109. The ion beam 102 performs a blanket implantation of an entire surface of the workpiece 100 and a selective or patterned implant of only a portion of the surface of the workpiece 109 through the openings 107 in the mask segment 103. In FIG. 8D, both the mask segments 103, 104 moved to a first position. The workpieces 100, 109 may be unloaded from the platen 101. In one instance, this embodiment of FIG. 8 may enable a blanket dose of ions across the workpieces 100, 109 and then a selective implant dose of ions in certain regions of the workpieces 100, 109 where conductive contacts may later be formed. This may enable a SE solar cell design.

FIGS. 9A-D are top cross-sectional views of a third embodiment of ion implantation. In FIG. 9A, a workpiece 100 is disposed on the platen 101 while the mask segments 103, 104 are in a first position. In FIG. 9B, the mask segment 104 is moved to a second position and an ion beam 102 is directed at the workpiece 100. The ion beam 102 performs a selective or patterned implant or only a portion of the surface of the workpiece 100 through the openings 107 in the mask segment 104. While the ion beam 102 is directed at the workpiece 100, a workpiece 109 is loaded on the platen 101 or another region of the platen 101 while the mask segment 103 is in a first position. In FIG. 9B, the ion beam 102 may have dimensions, a scan pattern, or be blocked upstream of the workpieces 100, 109 such that the ion beam 102 only implants the workpiece 100.

In FIG. 9C, the mask segment 103 is moved to a second position while the mask segment 104 is moved to a first position and the ion beam 102 is directed at the workpiece 109. The ion beam 102 performs a selective or patterned implant or only a portion of the surface of the workpiece 109 through the openings 107 in the mask segment 103. While the ion beam 102 is directed at the workpiece 109, the workpiece 100 is unloaded from the platen 101 or another region of the platen 101 while the mask segment 104 is in a first position. In FIG. 9C, the ion beam 102 may have dimensions, a scan pattern, or be blocked upstream of the workpieces 100, 109 such that the ion beam 102 only implants the workpiece 109. In FIG. 9D, both mask segments 103, 104 are in a first position while the workpiece 109 is unloaded. The embodiments illustrated in FIGS. 9A-D may increase throughput of an implanter. A blanket implant of the workpiece 100 and/or workpiece 109 with the mask segments 103, 104 in a first position may be included in the embodiment of FIGS. 9A-D.

Figure 9:
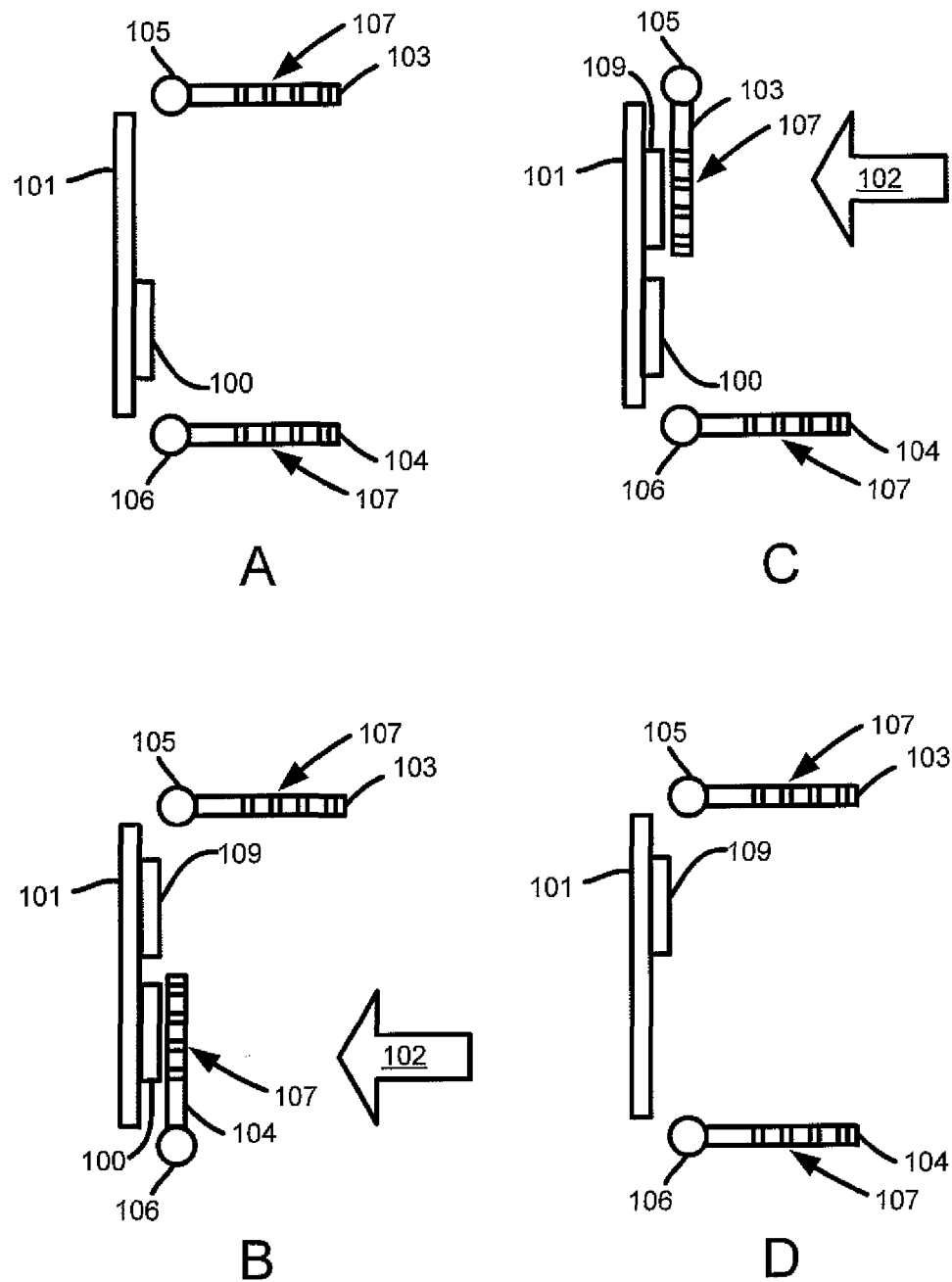
FIGS. 9A-D are top cross-sectional views of a third embodiment of ion implantation.

In an alternate embodiment of FIG. 9, the mask segments 103, 104 and workpiece loading and unloading may continuously alternate the steps illustrated in FIGS. 9B-C. Thus, one workpiece may be implanted while the other is loaded or unloaded. In yet another embodiment, the mask segment 103 and mask segment 104 are translated in opposite directions at least partially simultaneously.

The ion beam 102 may change species between blanket implants and selective or patterned implants of the workpiece. In one instance, the ion beam 102 changes from n-type to p-type dopants between the blanket and selective or patterned implants. This may enable counterdoping of a workpiece. In one particular embodiment, the counterdoping during the selective or patterned implant may enable an interdigitated back contact (IBC) solar cell design. This IBC solar cell design has alternating p-type and n-type regions across the surface of the workpiece. The apertures 107 in the mask segments 103, 104 may allow counterdoping to form one of the alternating n-type or p-type regions.

Figure 10:
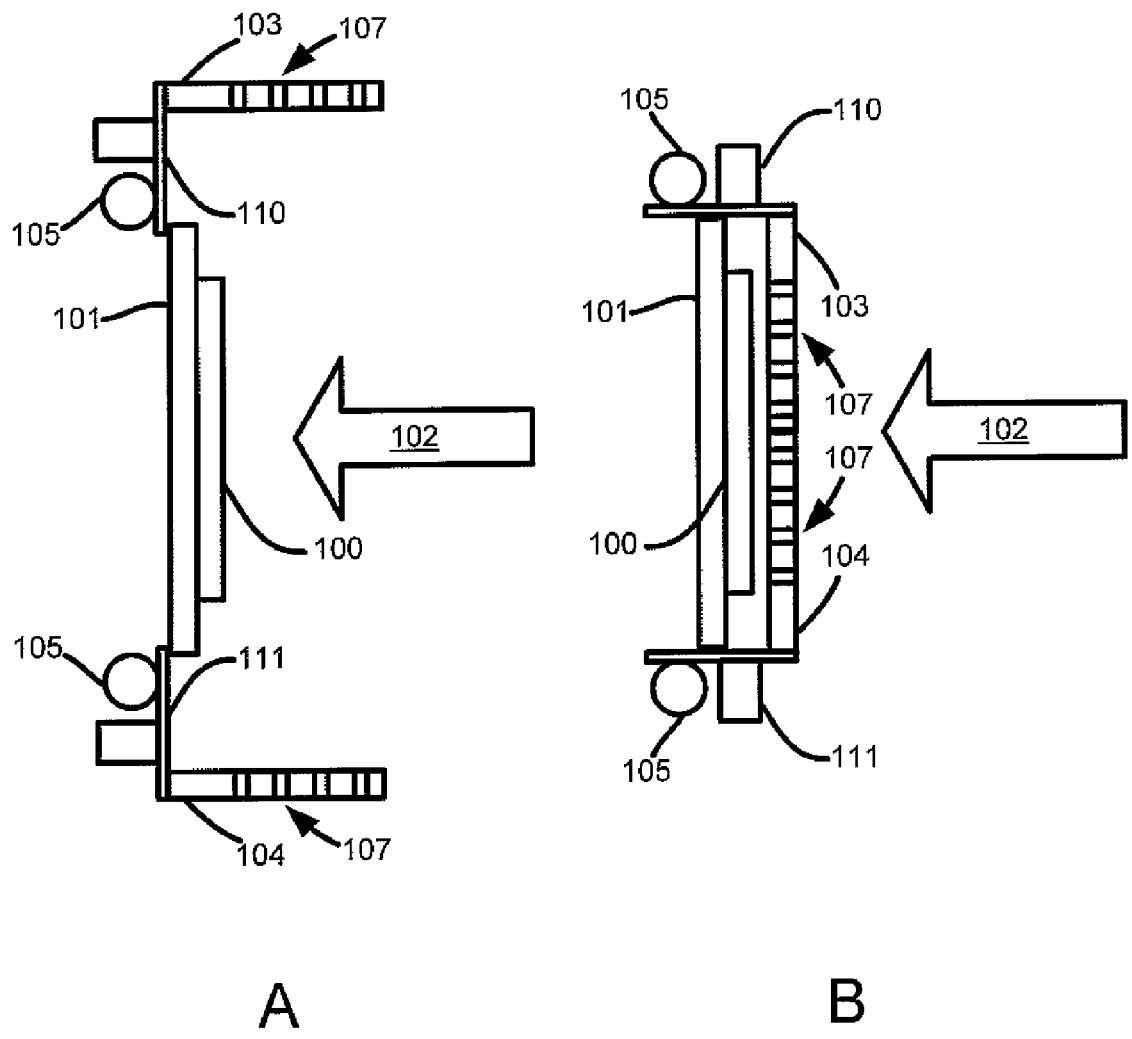
FIGS. 10A-B are top cross-sectional views of guards for a mask in a first position and second position.

FIGS. 10A-B are top cross-sectional views of guards for a mask in a first position and second position. In this embodiment, the hinges 105, 106 are not exposed to an ion beam 102 because the hinges 105, 106 may be damaged by the ion beam 102. Guards 110, 111 protect the hinges 105, 106 from any ion beam 102 impacts. In an alternate embodiment, the hinges 105, 106 are configured to be outside a scan pattern or implant region of the ion beam 102.

The use of the mask segments 103, 104 in at least a first position and a second position as described in the embodiments herein allows a selective or patterned implant with or without performance of a blanket implant of the workpiece 100. Furthermore, the mask segments 103, 104 allow for a quick loading and unloading of the workpieces 100 from the platen 101. Thus, multiple implants of, for example, SE or IBC solar cells may be performed without breaking vacuum. This increases productivity, removes the need for multiple process steps, reduces production cost, and removes the need for separate ion implanters to perform the blanket and selective or patterned implants.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for implanting workpieces comprising:
   a workpiece disposed in a path of an ion beam, said workpiece having a first area;
   two mask segments, each mask segment having a plurality of apertures, said two mask segments configured to cover said first area of said workpiece; and
   a hinge disposed on each of said mask segments, wherein a gap is defined between said hinges and said gap is configured to enable said workpiece to pass therebetween.

2. The apparatus of claim 1, further comprising an actuator system configured to translate said mask segments between a first position and a second position.

3. The apparatus of claim 1, further comprising at least a second workpiece having a second area disposed in said path of said ion beam, wherein said two mask segments are configured to cover said first area and said second area.

4. The apparatus of claim 3, further comprising a third workpiece and a fourth workpiece disposed in said path of said ion beam, said two mask segments configured to cover said third and fourth workpieces.

5. The apparatus of claim 3, further comprising a third workpiece, fourth workpiece, fifth workpiece, and sixth workpiece disposed in the path of said ion beam, said two mask segments configured to cover said third, fourth, fifth, and sixth workpieces.

6. The apparatus of claim 1, wherein said workpiece has a first width and wherein each of said mask segments has a second width, said second width being greater than 50% of said first width.

7. The apparatus of claim 1, wherein said two mask segments are composed of a material selected from the group consisting of graphite, carbon carbon, silicon carbide, silicon nitride, and quartz.

8. A method of implantation comprising:
   loading a workpiece onto a platen when a plurality of mask segments are in a first position, wherein said loading comprising moving said workpiece between said plurality of mask segments;
   translating said plurality of mask segments from said first position to a second position, each mask segment having a plurality of apertures;
   performing a first ion implant of said workpiece through said plurality of apertures; and
   translating said plurality of mask segments from said second position to said first position, wherein said translating between said first position and said second position comprises rotating said plurality of mask segments using a plurality of hinges.

9. The method of claim 8, further comprising unloading said workpiece from said platen while said plurality of mask segments are in said first position.

10. The method of claim 8, further comprising performing a second ion implant of said workpiece with said ion beam while said plurality of mask segments are in said first position.

11. The method of claim 10, wherein said second ion implant is performed prior to said first ion implant.

12. The method of claim 8, wherein said disposing further comprises disposing at least a second workpiece onto said platen.

13. A method of implantation comprising:
   loading a first workpiece on a platen behind a first mask segment and a second mask segment, each of said first and second mask segments having a plurality of aperture, wherein said loading comprising moving said first workpiece through an opening between said first mask segment and said second mask segment;
   translating said first mask segment from a first position to a second position;
   implanting an ion beam through said plurality of apertures of said first mask segment into said first workpiece;
   loading a second workpiece on said platen through said opening between said first mask segment and said second mask segment;
   translating said second mask segment from a first position to a second position;
   implanting said ion beam through said plurality of apertures of said second mask segment into said second workpiece;
   translating said first mask segment from said second position to said first position, wherein said translating said first mask segment and said translating said second mask segment comprise rotating at least one of said first mask segment and said second mask segment using at least one of a plurality of hinges; and
   unloading said first workpiece.

14. The method of claim 13, wherein said loading said second workpiece occurs at least partially simultaneously with said implanting said first workpiece and said unloading said first workpiece occurs at least partially simultaneously with said implanting said second workpiece.

15. The method of claim 13, further comprising translating said second mask segment from said second position to said first position and unloading said second workpiece.

16. The method of claim 13, wherein said translating said second mask segment from said first position to said second position is at least partially simultaneous with said translating said first mask segment from said second position to said first position.

17. The method of claim 8, wherein said translating said plurality of mask segments from said first position to said second position comprises moving each of said plurality of mask segments 90° with respect to a surface of said workpiece.

18. The method of claim 13, wherein said translating said first mask segment from said first position to said second position comprises moving said first mask segment 90° with respect to a surface of said first workpiece.

19. The method of claim 13, wherein said translating said second mask segment from said first position to said second position comprises moving said second mask segment 90° with respect to a surface of said second workpiece.

* * * * *